United States Patent
Kim et al.

(10) Patent No.: US 9,252,196 B2
(45) Date of Patent: Feb. 2, 2016

(54) ORGANIC LIGHT-EMITTING DIODE, ORGANIC LIGHT-EMITTING DISPLAY DEVICE INCLUDING THE SAME, AND METHOD OF CONTROLLING DUAL EMISSION OF ORGANIC LIGHT-EMITTING DIODE

(71) Applicant: SAMSUNG DISPLAY CO., LTD., Yongin, Gyeonggi-Do (KR)

(72) Inventors: Sang-Yeol Kim, Yongin (KR); Ki-Nyeng Kang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 52 days.

(21) Appl. No.: 13/860,510

(22) Filed: Apr. 10, 2013

(65) Prior Publication Data
US 2014/0167626 A1 Jun. 19, 2014

(30) Foreign Application Priority Data
Dec. 13, 2012 (KR) .................. 10-2012-0145707

(51) Int. Cl.
*H01L 51/52* (2006.01)
*H01L 27/32* (2006.01)
*H01L 51/50* (2006.01)

(52) U.S. Cl.
CPC .......... *H01L 27/3267* (2013.01); *H01L 51/504* (2013.01); *H01L 2251/564* (2013.01)

(58) Field of Classification Search
CPC .................................................. H01L 51/52
USPC .......... 257/10, 40, 98, 99, 103; 313/503, 504, 313/506
See application file for complete search history.

(56) References Cited

U.S. PATENT DOCUMENTS

| | | | | |
|---|---|---|---|---|
| 6,028,327 | A * | 2/2000 | Mizoguchi et al. | 257/98 |
| 6,337,492 | B1 * | 1/2002 | Jones et al. | 257/40 |
| 7,102,282 | B1 * | 9/2006 | Yamada | H01L 27/322 313/504 |
| 7,250,728 | B2 | 7/2007 | Chen et al. | |
| 8,008,851 | B2 * | 8/2011 | Sung et al. | 313/504 |
| 8,860,302 | B2 * | 10/2014 | Fukuda | H01K 1/26 313/504 |
| 2006/0250079 | A1 * | 11/2006 | Kwok | H01L 51/5278 313/506 |
| 2006/0261731 | A1 * | 11/2006 | Aziz et al. | 313/504 |
| 2007/0114522 | A1 | 5/2007 | Kwok et al. | |

(Continued)

FOREIGN PATENT DOCUMENTS

| | | |
|---|---|---|
| JP | 2005-310782 A | 11/2005 |
| JP | 2009-266520 A | 11/2009 |

(Continued)

OTHER PUBLICATIONS

EPO Search Report dated Apr. 4, 2014, for corresponding European Patent application 13176316.1, (8 pages).

*Primary Examiner* — Tung X Le
(74) *Attorney, Agent, or Firm* — Christie, Parker & Hale, LLP

(57) ABSTRACT

An organic light-emitting diode, an organic light-emitting display device including the same, and a method of controlling dual emission of the organic light-emitting diode. The organic light-emitting diode includes: a first electrode and a second electrode facing each other; a common electrode interposed between the first electrode and the second electrode; a first organic layer interposed between the first electrode and the common electrode; and a second organic layer that is interposed between the second electrode and the common electrode and is reverse-symmetric to the first organic layer with respect to the common electrode.

19 Claims, 16 Drawing Sheets

(56) References Cited

U.S. PATENT DOCUMENTS

2010/0308353 A1    12/2010  Grabowski et al.
2012/0018717 A1*   1/2012   Kim et al. ................. 257/40
2012/0037899 A1*   2/2012   Yamazaki et al. ........... 257/40
2012/0326132 A1*   12/2012  Ko et al. .................. 257/40

FOREIGN PATENT DOCUMENTS

| | | |
|---|---|---|
| KR | 10-0684100 B1 | 2/2007 |
| KR | 10-2010-0126428 A | 12/2010 |
| WO | WO 2010/100585 A2 | 9/2010 |
| WO | WO 2010/100585 A3 | 9/2010 |

* cited by examiner (a)

(b)

(a)

(b)

ORGANIC LIGHT-EMITTING DIODE, ORGANIC LIGHT-EMITTING DISPLAY DEVICE INCLUDING THE SAME, AND METHOD OF CONTROLLING DUAL EMISSION OF ORGANIC LIGHT-EMITTING DIODE

CROSS-REFERENCE TO RELATED PATENT APPLICATION

This application claims priority to and the benefit of Korean Patent Application No. 10-2012-0145707, filed on Dec. 13, 2012, in the Korean Intellectual Property Office, the disclosure of which is incorporated herein in its entirety by reference.

BACKGROUND

1. Field

The following description relates to an organic light-emitting diode, an organic light-emitting display device including the same, and a method of controlling dual emission of the organic light-emitting diode.

2. Description of the Related Art

Among various flat panel display devices, organic light-emitting display devices are self-emission display devices that electrically excite an organic compound to emit light. Such organic light-emitting display devices are manufactured at a low temperature, have high response speeds, have low power consumption, self-emit light, and have wide-viewing angles. In addition, organic light-emitting display devices have high contrast characteristics and do not require a backlight, which is required by a liquid crystal display (LCD), thereby enabling the production of lightweight and thin devices. In addition, organic light-emitting display devices have uniform surface emission characteristics and are easy to manufacture, and due to such characteristics, they are used in mobile phones.

Recently, research into dual-emission organic light-emitting display devices that can emit light on front and back sides thereof is being performed. In the case of a single panel, front and back side images (produced by an organic light-emitting display that emits light in two directions by controlling two electrodes of an organic light-emitting diode) are reversed images. On the other hand, when two panels are separately manufactured and then attached to each other, the attachment of the two panels results in high manufacturing costs, increased thickness, high consumption costs, or the like.

SUMMARY

Aspects of embodiments of the present invention are directed toward various display modes with relatively small occupation space by selectively or simultaneously supplying identical or different images on front and back sides via a single panel.

According to an embodiment of the present invention, there is provided an organic light-emitting diode including: a first electrode and a second electrode facing each other; a common electrode interposed between the first electrode and the second electrode; a first organic layer interposed between the first electrode and the common electrode; and a second organic layer that is interposed between the second electrode and the common electrode and is reverse-symmetric to the first organic layer with respect to the common electrode.

In one embodiment, the first organic layer includes a hole injection layer, a hole transfer layer, an emission layer, an electron transfer layer, and an electron injection layer, sequentially disposed in this order on the first electrode, and the second organic layer includes an electron injection layer, an electron transfer layer, an emission layer, a hole transfer layer, and a hole injection layer, sequentially disposed in this order on the second electrode.

In one embodiment, the first electrode is a bottom electrode, and the second electrode is a top electrode. In another embodiment, the first electrode is a top electrode, and the second electrode is a bottom electrode.

In one embodiment, a first power voltage is applied to the first electrode and the second electrode, and a second power voltage is applied to the common electrode, and according to a variation of the first power voltage and/or the second power voltage, the common electrode functions as an electron injection electrode or a hole injection electrode.

Each of the first electrode and the second electrode may be a transparent electrode or a semi-transparent electrode. The common electrode may be a reflective electrode.

One of the first electrode and the second electrode may be formed on a substrate.

According to another embodiment of the present invention, there is provided a method of controlling a dual emission of an organic light-emitting diode, wherein the organic light-emitting diode includes a first electrode, a second electrode, a pair of organic layers disposed between the first and second electrodes, and a common electrode that divides the organic layers between the first electrode and the second electrode, wherein the method includes: applying a first power voltage to the first electrode and the second electrode; and applying a second power voltage to the common electrode, wherein the first power voltage and/or the second power voltage varies and the organic layers alternately emit light toward the first electrode and the second electrode in response to this variation.

The applying of the second power voltage may include alternately applying a second power voltage with higher and lower levels than the first power voltage to the common electrode.

The applying of the first power voltage may include alternately applying a first power voltage with higher and lower levels than the second power voltage to the first electrode and the second electrode.

The applying of the first power voltage may include applying the first power voltage with a first level and a second level that is higher than the first level, and the applying of the second power voltage may include alternately applying the second power voltage with the first level and the second level, wherein the first power voltage and the second power voltage are inversion voltages.

According to another embodiment of the present invention, provided is an organic light-emitting display device including: a plurality of organic light-emitting diodes including a first electrode, a second electrode, a common electrode interposed between the first electrode and the second electrode, and a pair of organic layers that are reverse-symmetric to each other with respect to the common electrode between the first electrode and the second electrode; and a power supplier applying a first power voltage to the first and second electrodes and a second power voltage to the common electrode and varying the first power voltage and/or the second power voltage, wherein each of the organic light-emitting diodes emits light either toward the first electrode or toward the second electrode according to the varied first power voltage and second power voltage.

In one embodiment, the power supplier fixes the first power voltage and applies the second power voltage with higher and lower levels than the first power voltage to the common electrode.

In one embodiment, the power supplier fixes the second power voltage and applies the first power voltage with higher and lower levels than the second power voltage to the first electrode and the second electrode.

In one embodiment, the power supplier alternately applies the first power voltage with a first level and a second level that is higher than the first level, and simultaneously, alternately applies the second power voltage with the first level and the second level, wherein the first power voltage and the second power voltage are inversion voltages.

In one embodiment, the first power voltage and/or the second power voltage varies in every frame or within one frame.

In one embodiment, one of the first electrode and the second electrode is formed on a substrate.

In one embodiment, each of the first electrode and the second electrode is a transparent electrode or a semi-transparent electrode, and the common electrode is a reflective electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
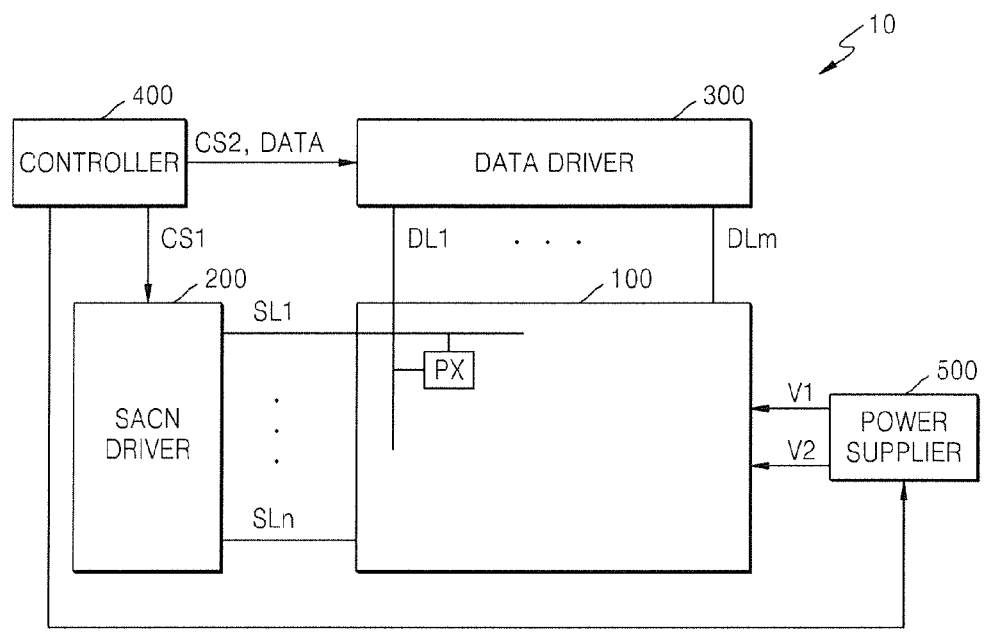
FIG. 1 is a schematic block diagram of an organic light-emitting display device according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

In the description of the present invention, certain detailed explanations of related art are omitted when it is deemed that they may unnecessarily obscure the essence of the invention, and throughout the specification, like reference numerals refer to like elements.

In addition, in the drawings, sizes and thickness of constituents are arbitrarily illustrated to obtain ease of description, and thus, the present invention is not limited thereto.

In the drawings, the thicknesses of layers and regions are exaggerated for clarity. Also, in the drawings, the thicknesses of layers and regions are exaggerated for ease of description. It will also be understood that when a layer, a film, a region, a plate, or the like is referred to as being "on" another layer or substrate, it can be 'directly on' the other constituent, or intervening layers may also be present.

In the present specification, it is to be understood that the terms such as "including" are intended to indicate the existence of constituents disclosed in the specification, and are not intended to preclude the possibility that other constituents may exist, but may be added. Also, in the specification, the term "on" indicates being above or under other constituents, and it is not necessary that a constituent exists only above other constituents with respect to a gravity direction.

FIG. 1 is a schematic block diagram of an organic light-emitting display device 10 according to an embodiment of the present invention.

Referring to FIG. 1, the organic light-emitting display device 10 according to the present embodiment includes a display panel 100, a scan driver 200, a data driver 300, a controller 400, and a power supplier 500.

The organic light-emitting display device 10 may selectively or simultaneously provide identical or different images on front and back sides thereof through the display panel 100.

The display panel 100 includes a plurality of scan lines SL1 to SLn that are spaced apart from each other and aligned in rows and a plurality of data lines DL1 to DLm that are spaced apart from each other and aligned in columns, wherein the scan lines SL1 to SLn and the data lines DL1 to DLm are aligned in a matrix form. A pixel PX is located near each of the intersections (crossing regions) of the scan lines SL1 to SLn and the data lines DL1 to DLm, and thus, the pixels PX are aligned in a matrix form. An alignment direction of pixels PX in each row, that is, a direction along a scan line for selecting a row is referred to as a row direction, and an alignment direction of pixels PX in each column, that is, a direction perpendicular to the scan line is referred to as a column direction.

The scan driver 200 may generate scan signals and may sequentially supply the scan signals to the display panel 100 through the scan lines SL1 to SLn.

The data driver 300 may generate data signals and may sequentially supply the data signals to the display panel 100 through the data lines DL1 to DLm. The data driver 300 converts input image data DATA having gradation input from the controller 400 into a data signal in the form of a voltage or a current.

The controller 400 generates a scan control signal CS1 and a data control signal CS2 and transmits the scan control signal CS1 and the data control signal CS2 to the scan driver 200 and the data driver 300, respectively. Accordingly, the scan driver 200 sequentially applies scan signals through scan lines, and the data driver 300 applies data signals to pixels. The controller 400 outputs image data DATA to the data driver 300.

The controller 400 may drive the display panel 100 in a single emission mode for operating one of a front side and a back side or a dual emission mode for operating both front and back sides of the display panel 100. In the dual emission mode, the controller 400 may control the power supplier 500 in such a manner that the front and back sides of the display panel 100 alternately emit light to display an image.

The power supplier 500 converts a voltage input by an external power source, such as a battery, into a first power voltage V1 and a second power voltage V2 for the emission of a light-emitting device of the display panel 100. The power supplier 500, under control of the controller 400, varies at least one of the first power voltage V1 or the second power voltage V2 and applies the varied voltage to the display panel 100. The power supplier 500 may use a direct current-direct current (DC-DC) converter.

Figure 2:
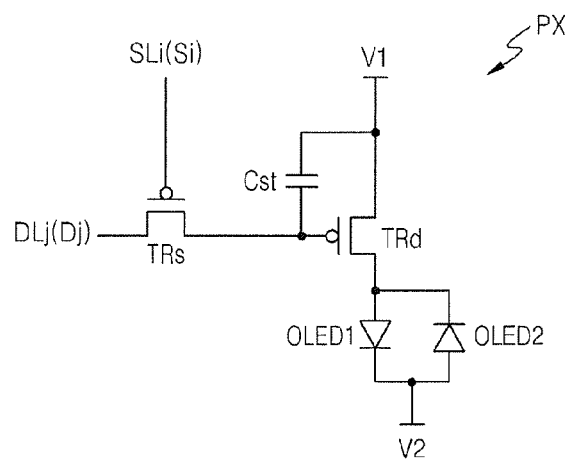
FIG. 2 is an equivalent circuit diagram of a pixel illustrated in FIG. 1 according to an embodiment of the present invention.

FIG. 2 is an equivalent circuit diagram of a pixel PX in FIG. 1 according to an embodiment of the present invention.

Referring to FIG. 2, the pixel PX may include two thin film transistors and one capacitor.

The pixel PX may include an organic light-emitting diode OLED, a driving thin film transistor TRd, a switching thin film transistor TRs, and a storage capacitor Cst, connected between a first power voltage V1 and a second power voltage V2.

The organic light-emitting diode OLED includes a first organic light-emitting diode OLED1 that emits light on one of front and rear sides of the display panel 100, and a second organic light-emitting diode OLED2 that emits light on the other side thereof.

The display panel 100 time-sharing drives the first organic light-emitting diode OLED1 and the second organic light-emitting diode OLED2 of the pixel PX to express an image on a front side and a back side thereof. Herein, the front side and the back side are not particularly defined, and a side typically viewed by a user may be referred to as the front side and the opposite side may be referred to as the back side. In this regard, the front side may be bottom emission and the back side may be top emission, and according to another embodiment, the front side may be bottom emission and the back side may be top emission.

The driving thin film transistor TRd controls a current flowing between the first power voltage V1 and the second power voltage V2 through the first organic light-emitting diode OLED1 or the second organic light-emitting diode OLED2, corresponding to a voltage stored in the storage capacitor Cst during emission of the pixel PX. A gate electrode of the driving thin film transistor TRd is connected to a first terminal of the storage capacitor Cst, and the source electrode S1 of the driving thin film transistor TRd is connected to a second terminal of the storage capacitor Cst and the first power voltage V1. In addition, a drain electrode of the driving thin film transistor TRd is connected to an anode of the first organic light-emitting diode OLED1 and a cathode of the second organic light-emitting diode OLED2.

The switching thin film transistor TRs is connected to and interposed between a data line DLj and the driving thin film transistor TRd, and when a scan signal Si is supplied through a scan line SLi, the switching thin film transistor TRs is turned on to supply the data signal Dj supplied through the data line DLj to the storage capacitor Cst. The storage capacitor Cst is charged with a voltage corresponding to the data signal Dj. That is, a gate electrode of the switching thin film transistor TRs is connected to the scan line SLi, and a source electrode thereof is connected to the data line DLj. A drain electrode of the switching thin film transistor TRs is connected to the first terminal of the storage capacitor Cst.

The anode of the first organic light-emitting diode OLED1 and the cathode of the second organic light-emitting diode OLED2 are connected to the first power voltage V1 through the driving thin film transistor TRd. A cathode of the first organic light-emitting diode OLED1 and an anode of the second organic light-emitting diode OLED2 are connected to the second power voltage V2. The cathode of the first organic light-emitting diode OLED1 and the anode of the second organic light-emitting diode OLED2 are a common electrode. That is, the common electrode functions as the cathode of the first organic light-emitting diode OLED1 and the anode of the second organic light-emitting diode OLED2. Here, the first organic light-emitting diode OLED1 and the second organic light-emitting diode OLED2, when the first power voltage V1 and the second power voltage V2 are applied thereto, emit light with brightness corresponding to a driving current flowing in the first organic light-emitting diode OLED1 and the second organic light-emitting diode OLED2.

The first power voltage V1 may be a fixed voltage or a variable voltage. In the latter case, the first power voltage V1 may be changed to a first voltage V11 or a second voltage V12 with a higher level than the first voltage V11. The second power voltage V2 may be a fixed voltage or a variable voltage. In the latter case, the second power voltage V2 may be changed to a third voltage V21 or a fourth voltage V22 with a higher level than the third voltage V21.

Since at least one of the first power voltage V1 or the second power voltage V2 varies, the first organic light-emitting diode OLED1 and the second organic light-emitting diode OLED2 are alternately forward-biased or reverse-biased. For example, when the first organic light-emitting diode OLED1 is forward-biased, the second organic light-emitting diode OLED2 is reverse-biased and the first organic light-emitting diode OLED1 emits light (and the second organic light-emitting diode OLED2 does not). On the other hand, when the first organic light-emitting diode OLED1 is reverse-biased, the second organic light-emitting diode OLED2 is forward-biased and emits light.

That is, according to the present invention, if the first organic light-emitting diode OLED1 is reverse-biased, the second organic light-emitting diode OLED2 emits light, and if the second organic light-emitting diode OLED2 is reverse-biased, the first organic light-emitting diode OLED1 emits light, thereby embodying dual emission.

Figure 3:
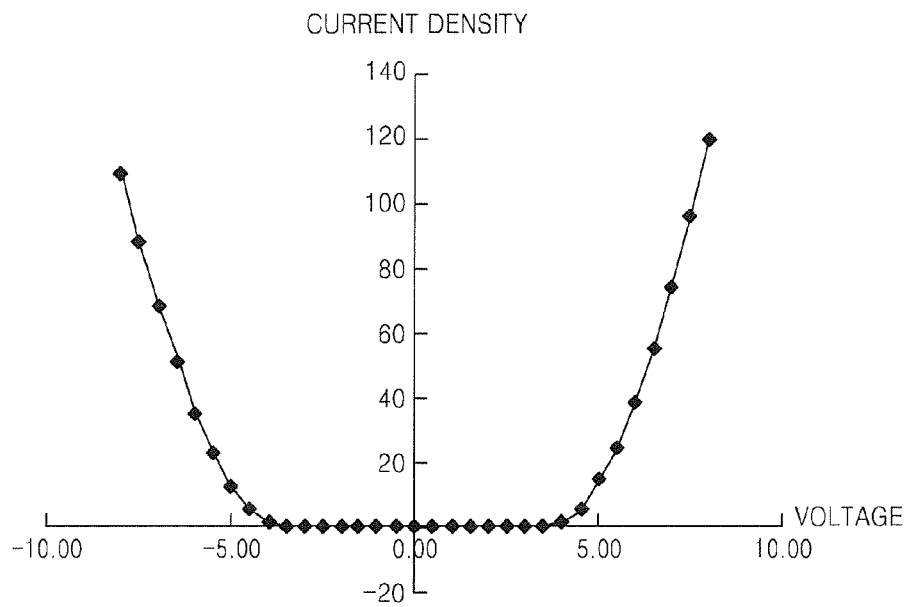
FIG. 3 is a graph of current density versus voltage characteristics of a dual emission display device according to an embodiment of the present invention.
Figure 4:
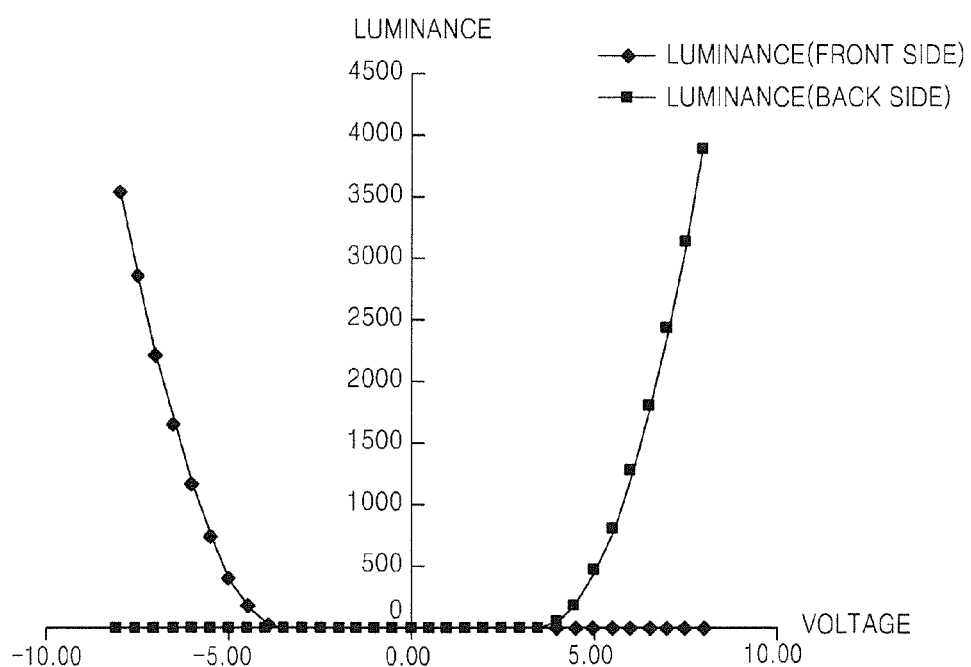
FIG. 4 is a graph of brightness versus voltage characteristics of a dual emission display device according to an embodiment of the present invention.

FIG. 3 is a graph of current density versus voltage characteristics of a dual display device according to an embodiment of the present invention. FIG. 4 is a graph of luminance versus voltage characteristics of a dual display device according to an embodiment of the present invention.

A typical organic light-emitting diode OLED shows diode characteristics, that is, during a reverse bias, a current does not flow. However, according to embodiments of the present invention, since the first organic light-emitting diode OLED1 and the second organic light-emitting diode OLED2 are reverse-symmetric to each other with respect to the common electrode, as illustrated in FIGS. 3 and 4, even during a reverse bias, a current flows substantially like during the forward bias. Accordingly, time-sharing dual emission is possible.

Figure 5:
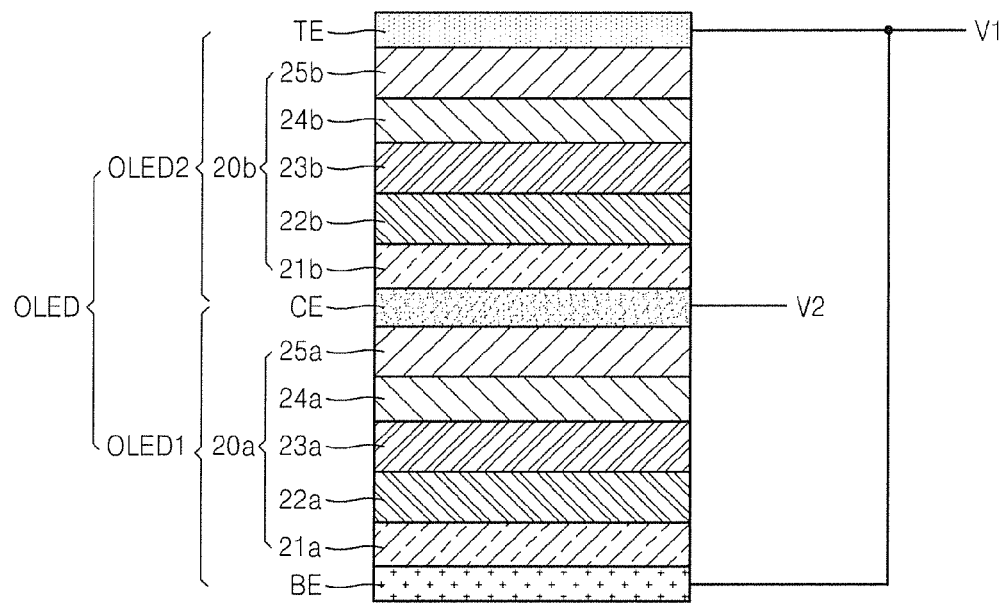
FIG. 5 is a schematic cross-sectional view of an organic light-emitting diode of FIG. 2, according to an embodiment of the present invention.

FIG. 5 is a schematic cross-sectional view of an organic light-emitting diode OLED of FIG. 2, according to an embodiment of the present invention.

Referring to FIG. 5, the organic light-emitting diode OLED according to the present embodiment includes a bottom electrode BE, a top electrode TE facing the bottom electrode BE, a common electrode CE disposed between the bottom electrode BE and the top electrode TE, and a pair of organic layers, namely, first and second organic layer 20a and 20b, that face each other and are reverse-symmetric to each other with respect to the common electrode CE. Accordingly, the organic light-emitting diode OLED includes the first organic light-emitting diode OLED1 and the second organic light-emitting diode OLED2, wherein the first organic light-emitting diode OLED1 includes the bottom electrode BE, the common electrode CE, and the first organic layer 20a between the bottom electrode BE and the common electrode CE, and the second organic light-emitting diode OLED2 includes the top electrode TE, the common electrode CE, and the second organic layer 20b between the top electrode TE and the common electrode CE.

The bottom electrode BE and the top electrode TE may be located at ends of the organic light-emitting diode OLED as a whole, and one of the bottom electrode BE and the top electrode TE may be formed on a substrate (not shown). Regarding each of the organic layers 20a and 20b, the bottom electrode BE and the top electrode TE may be formed of a transparent or semi-transparent material to transmit emitted light therethrough. To obtain an effective light transmission, the bottom electrode BE and the top electrode TE may each have transmittance of 70% or more. For example, the bottom electrode BE and the top electrode TE may each be formed of indium tin oxide (ITO), indium zinc oxide (IZO), tin oxide (SnO2), zinc oxide (ZnO), aluminum zinc oxide, or a combination thereof.

The common electrode CE may be a reflective electrode formed of a metal thin film. A material for forming the reflective electrode may be lithium (Li), magnesium (Mg), silver (Ag), aluminum (Al), aluminum-lithium (Al—Li), calcium (Ca), magnesium-indium (Mg—In), magnesium-silver (Mg—Ag), or the like.

The power supplier 500 may apply the first power voltage V1 to the bottom electrode BE and the top electrode TE, and may apply the second power voltage V2 to the common electrode CE. According to voltage levels of the first power voltage V1 and the second power voltage V2, the bottom electrode BE, the top electrode TE, and the common electrode CE may function as a hole injection electrode or an electron injection electrode.

The first organic layer 20a may have a stack structure of a hole injection layer (HIL) 21a, a hole transfer layer or hole transport layer (HTL) 22a, an emission layer (EML) 23a, an electron transfer layer or electron transport layer (ETL) 24a, and an electron injection layer (EIL) 25a, which are sequentially stacked on the bottom electrode BE in this order.

The second organic layer 20b may have a stack structure of an EIL 25b, an ETL 24b, an emission EML 23b, an HTL 22b, and an HIL 21b, which are sequentially stacked on the top electrode TE in this order.

As a material for forming the HILs 21a and 21b, for example, any one of various suitable hole injection materials may be used, including a phthalocyanine compound, such as a copper phthalocyanine;

a star-burst type amine derivative, such as TCTA, m-MTDATA, m-MTDAPB, or MoO3; and a conductive polymer with solubility, such as polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline-poly(4-styrenesulfonate) (PANI-PSS).

As a material for forming the HTLs 22a and 22b, for example, any one of various suitable hole transfer or transport materials may be used, including a carbazole derivative, such as N-phenylcarbazole or polyvinylcarbazole, and a typical amine derivative with an aromatic condensation ring, such as N,N'-bis(3-methylphenyl)-N,N'-diphenyl-[1,1-biphenyl]-4,4'-diamine (TPD), or N,N'-di(naphthalene-1-yl)-N,N'-diphenyl benzidine (α-NPD).

The EMLs 23a and 23b may each include a host material and a dopant material. Examples of the host material for the EMLs 23a and 23b are tris(8-hydroxy-quinolinato)aluminum (Alq3), 9,10-di(naphthy-2-yl)anthracene (AND), 3-tert-butyl-9,10-di(naphthy-2-yl)anthracene (TBADN), 4,4'-bis(2,2-diphenyl-ethene-1-yl)-4,4'-dimethylphenyl (DPVBi), 4,4'-bisBis(2,2-diphenyl-ethene-1-yl)-4,4'-dimethylphenyl (p-DMDPVBi), Tert(9,9-diarylfluorene) (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene) (BDAF), 4,4'-bis(2,2-diphenyl-ethene-1-yl)-4,4'-di-(tert-butyl)phenyl (p-TDPVBi), 1,3-bis(carbazole-9-yl)benzene (mCP), 1,3,5-tris(carbazole-9-yl)benzene (tCP), 4,4',4"-tris(carbazole-9-yl)triphenylamine (TcTa), 4,4'-bis(carbazole-9-yl)biphenyl (CBP), 4,4'-bisBis(9-carbazoleyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bisbis(9-phenyl-9H-carbazole)fluorene (FL-4CBP), 4,4'-bis(carbazole-9-yl)-9,9-di-tolyl-fluorene (DPFL-CBP), and 9,9-bis(9-phenyl-9H-carbazole)fluorene (FL-2CBP). Examples of the dopant material for the EMLs 23a and 23b are 4,4'-bis[4-(di-p-tolylamino)styryl]biphenyl (DPAVBi), 9,10-di(naph-2-thyl)anthraene (ADN), and 3-tert-butyl-9,10-di(naph-2-thyl)anthraene (TBADN).

Each of the EMLs 23a and 23b may be a red EML, a green EML, or a blue EML, according to a red sub pixel, a green sub pixel, or a blue sub pixel. When the EMLs 23a and 23b emit white light, the EMLs 23a and 23b may each have a multi-layered structure of a red EML, a green EML, and a blue EML to emit the white light, or a single-layered structure including a red emission material, a green emission material, and a blue emission material.

A material for forming the ETLs 24a and 24b may be any one of various suitable materials that stably transfer or transport injected electrons, and examples thereof are an oxazole-based compound, an isooxazole-based compound, a triazole-based compound, an isothiazole-based compound, an oxadiazole-based compound, a thiadiazole-based compound, a perylene-based compound, an aluminum complex (for example, tris(8-quinolinolato)-aluminum (Alq3)), BAlq, SAlq, Almq3, and gallium complex (for example, Gaq'2OPiv, Gaq'2OAc, and 2 Gaq'2).

A material for forming the EILs 25a and 25b may be any one of various materials that allow electrons to be easily injected from an electron injection electrode. To form the electron injection layers 25a and 25b, any one of various known materials that are used as a material for forming an EIL may be used, and examples thereof are LiF, NaCl, CsF, Li2O, BaO, BaF2, and a mixture of CsCO3 and BCP. The EILs 25a and 25b may be deposited under conditions similar to those used in forming the HILs 21a and 21b, although the deposition conditions may vary according to a compound used to form the EILs 25a and 25b.

Figure 6:
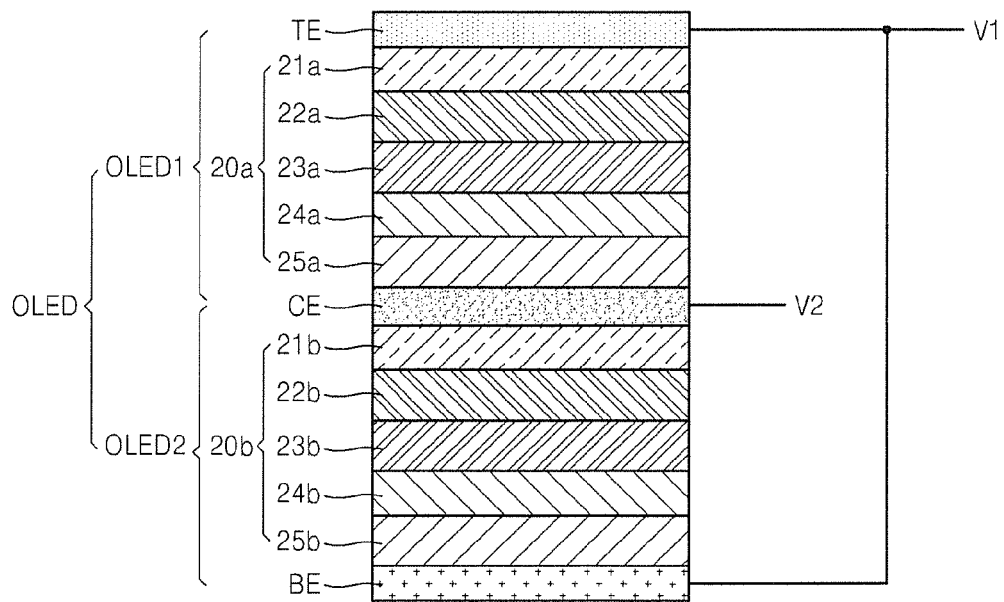
FIG. 6 is a schematic cross-sectional view of the organic light-emitting diode of FIG. 2, according to another embodiment of the present invention.

FIG. 6 is a schematic cross-sectional view of the organic light-emitting diode OLED of FIG. 2, according to another embodiment of the present invention. The organic light-emitting diode OLED of FIG. 6 is distinguished from the organic light-emitting diode OLED of FIG. 5, in terms of the stack sequence order of the first and second organic layers 20a and 20b.

The organic light-emitting diode OLED according to the present embodiment includes a pair of the bottom electrode BE and the top electrode TE, the common electrode CE disposed between the bottom electrode BE and the top electrode TE, and the first and second organic layers 20a and 20b that face each other and are reverse-symmetric to each other with respect to the common electrode CE. Accordingly, the organic light-emitting diode OLED includes the first organic light-emitting diode OLED1 and the second organic light-emitting diode OLED2, wherein the first organic light-emitting diode OLED1 includes the top electrode TE, the common electrode CE, and the first organic layer 20a between the top electrode TE and the common electrode CE, and the second organic light-emitting diode OLED2 includes the bottom electrode BE, the common electrode CE, and the second organic layer 20b between the bottom electrode BE and the common electrode CE.

The bottom electrode BE and the top electrode TE may be located at ends of the organic light-emitting diode OLED, and one of the bottom electrode BE and the top electrode TE may be formed on a substrate (not shown). Regarding each of the first and second organic layers 20a and 20b, the bottom electrode BE and the top electrode TE may be formed of a transparent or semi-transparent material to transmit emitted light therethrough. To obtain an effective light transmission, the bottom electrode BE and the top electrode TE may each have transmittance of 70% or more. For example, the bottom electrode BE and the top electrode TE may each be formed of indium tin oxide (ITO), indium zinc oxide (IZO), tin oxide (SnO2), zinc oxide (ZnO), aluminum zinc oxide, or a combination thereof.

The common electrode CE may be a reflective electrode formed of a metal thin film. A material for forming the reflective electrode may be lithium (Li), magnesium (Mg), silver (Ag), aluminum (Al), aluminum-lithium (Al—Li), calcium (Ca), magnesium-indium (Mg—In), magnesium-silver (Mg—Ag), or the like.

The power supplier 500 may apply the first power voltage V1 to the bottom electrode BE and the top electrode TE, and may apply the second power voltage V2 to the common electrode CE. According to voltage levels of the first power voltage V1 and the second power voltage V2, the bottom electrode BE, the top electrode TE, and the common electrode CE may function as a hole injection electrode or an electron injection electrode.

The first organic layer 20a may have a stack structure of an HIL 21a, an HTL 22a, an EML 23a, an ETL 24a, and an EIL 25a, which are sequentially stacked on the top electrode TE in this order.

The second organic layer 20b may have a stack structure of an EIL 25b, an ETL 24b, an EML 23b, an HTL 22b, and an HIL 21b, which are sequentially stacked on the bottom electrode BE in this order.

The materials for forming the layers that constitute the first organic layer 20a and the second organic layer 20b are the same as those for forming the layers that constitute the first organic layer 20a and the second organic layer 20b illustrated in FIG. 5, and accordingly, will not be described again.

Figure 7:
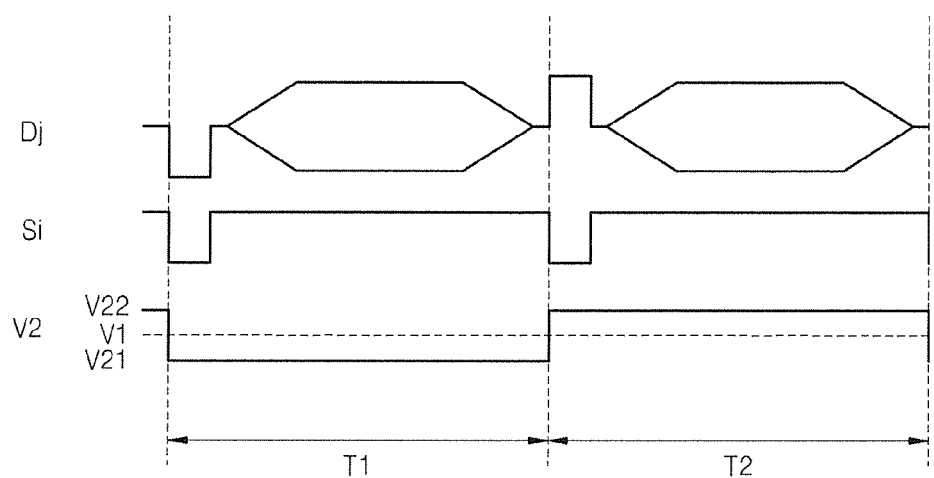
FIG. 7 is a timing diagram for explaining a dual emission of an organic light-emitting diode, according to an embodiment of the present invention.
Figure 8:
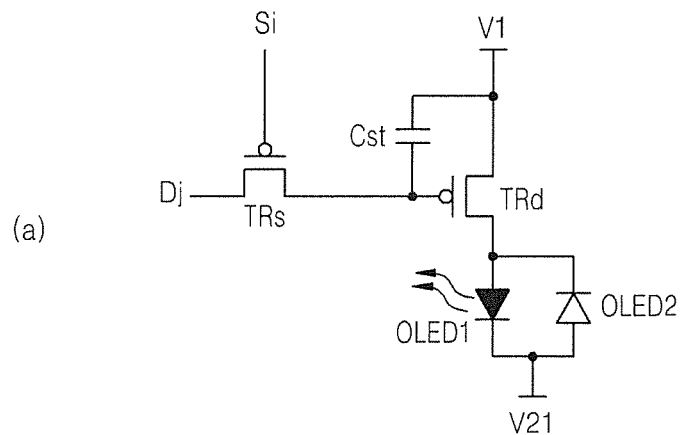
FIG. 8 is a diagram illustrating a dual emission of an organic light-emitting diode according to the timing diagram of FIG. 7.
Figure 8:
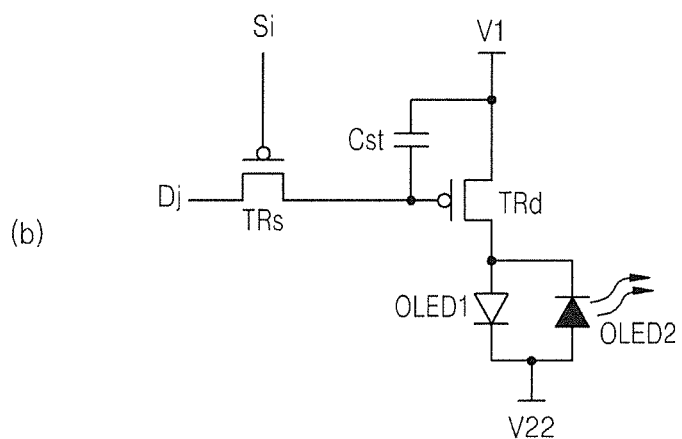

FIG. 7 is a timing diagram for explaining a dual emission of an organic light-emitting diode OLED, according to an embodiment of the present invention. FIG. 8 is a circuit diagram illustrating a dual emission of the organic light-emitting diode OLED according to the timing diagram of FIG. 7.

Referring to FIGS. 7 and 8, when a scan signal Si is supplied through a scan line, the switching thin film transistor TRs is turned on to supply a data signal Dj supplied through a data line to the storage capacitor Cst.

In this regard, the first power voltage V1 is fixed and the second power voltage V2 alternately swings between a third voltage V21 and a fourth voltage V22. That is, during a first period T1, the third voltage V21 is applied as the second power voltage V2, and during a second period T2, the fourth voltage V22 is applied as the second power voltage V2. The third voltage V21 is a voltage with a lower level than the first power voltage V1, and the fourth voltage V22 is a voltage with a higher level than the first power voltage V1. For example, the first power voltage V1 may be 12 V, the third voltage V21 may be 0 V, and the fourth voltage V22 may be 24 V. Each of the first period T1 and the second period T2 may constitute one frame period, or the sum of the first period T1 and the second period T2 may constitute one frame period. That is, the second power voltage V2 may vary in every frame, or may vary within one frame.

During the first period T1, when the first power voltage V1 and the third voltage V21 are applied, the first organic light-emitting diode OLED1 is forward-biased and the second organic light-emitting diode OLED2 is reverse-biased. The driving thin film transistor TRd may, corresponding to a voltage stored in the storage capacitor Cst, control a current flowing between the first power voltage V1 and the third voltage V21 through the first organic light-emitting diode OLED1, and accordingly, as illustrated in FIG. 8(a), the first organic light-emitting diode OLED1 emits light.

During the second period T2, the second power voltage V2 is transitioned to the fourth voltage V22 from the third voltage V21. During the second period T2, when the first power voltage V1 and the fourth voltage V22 are applied, the second organic light-emitting diode OLED2 is forward-biased and the first organic light-emitting diode OLED1 is reverse-biased. The driving thin film transistor TRd may, corresponding to a voltage stored in the storage capacitor Cst, control a current flowing between the first power voltage V1 and the fourth voltage V22 through the second organic light-emitting diode OLED2, and accordingly, as illustrated in FIG. 8(b), the second organic light-emitting diode OLED2 emits light.

Figure 9:
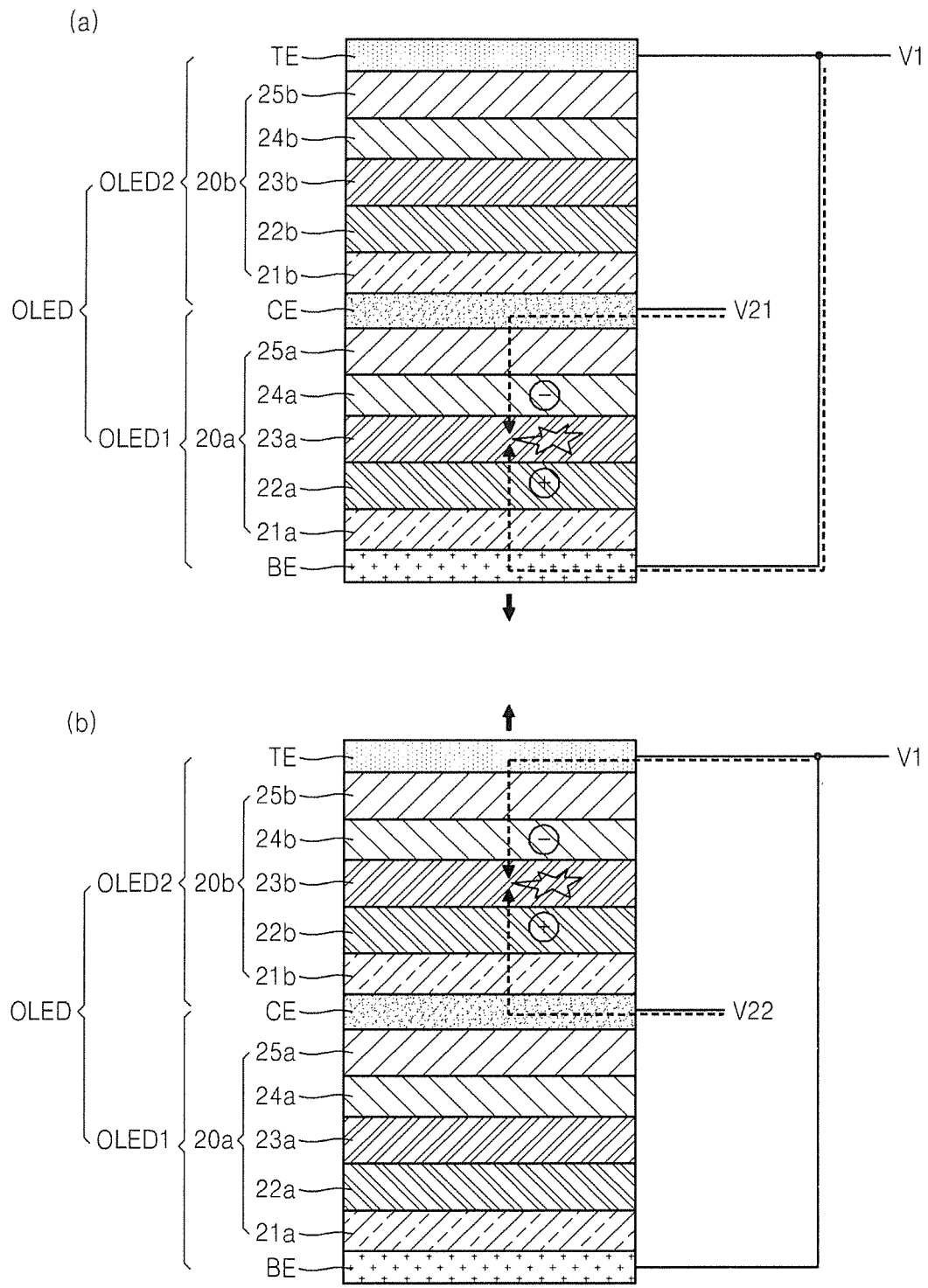
FIG. 9 is a view for explaining a dual emission of the organic light-emitting diode of FIG. 5 according to the timing diagram of FIG. 7, according to an embodiment of the present invention.

FIG. 9 is a view for explaining a dual emission of the organic light-emitting diode OLED of FIG. 5 according to the timing diagram of FIG. 7, according to an embodiment of the present invention.

Referring to FIGS. 7 and 9(a), during the first period T1, the fixed first power voltage V1 is applied to the top electrode TE and the bottom electrode BE, and the third voltage V21 is applied as the second power voltage V2 to the common electrode CE. Accordingly, the second organic light-emitting diode OLED2 formed between the top electrode TE and the common electrode CE is reverse-biased, and the first organic light-emitting diode OLED1 formed between the bottom electrode BE and the common electrode CE is forward-biased. Thus, the bottom electrode BE of the first organic light-emitting diode OLED1 functions as a hole injection electrode, and the common electrode CE functions as an electron injection electrode.

Electrons move from the common electrode CE of the first organic light-emitting diode OLED1 through the EIL 25a and the ETL 24a, and holes move from the bottom electrode BE through the HIL 21a and the HTL 22a. The electrons and holes are combined in the EML 23a to form excitons, and due to energy from the formed excitons, light is emitted. Since the common electrode CE is a reflective electrode, the generated light is emitted toward the bottom electrode BE (front side).

Referring to FIGS. 7 and 9(b), during the second period T2, the fixed first power voltage V1 is applied to the top electrode TE and the bottom electrode BE, and the fourth voltage V22 is applied as the second power voltage V2 to the common electrode CE. Accordingly, the second organic light-emitting diode OLED2 formed between the top electrode TE and the common electrode CE is forward-biased, and the first organic light-emitting diode OLED1 formed between the bottom electrode BE and the common electrode CE is reverse-biased. Thus, the top electrode TE of the second organic light-emitting diode OLED2 functions as an electron injection electrode, and the common electrode CE functions as a hole injection electrode.

Electrons are injected from the top electrode TE of the second organic light-emitting diode OLED2 through the EIL 25b and the ETL 24b, and holes are injected from the common electrode CE through the HIL 21b and the HTL 22b. The electrons and holes are combined in the EML 23b to form excitons, and due to energy from the formed excitons, light is emitted. Since the common electrode CE is a reflective electrode, the generated light is emitted toward the top electrode TE (back side).

That is, according to the present embodiment, the second power voltage V2 applied to the organic light-emitting diode OLED varies to alternately control a front side emission and a back side emission to produce images on back and front sides.

Figure 10:
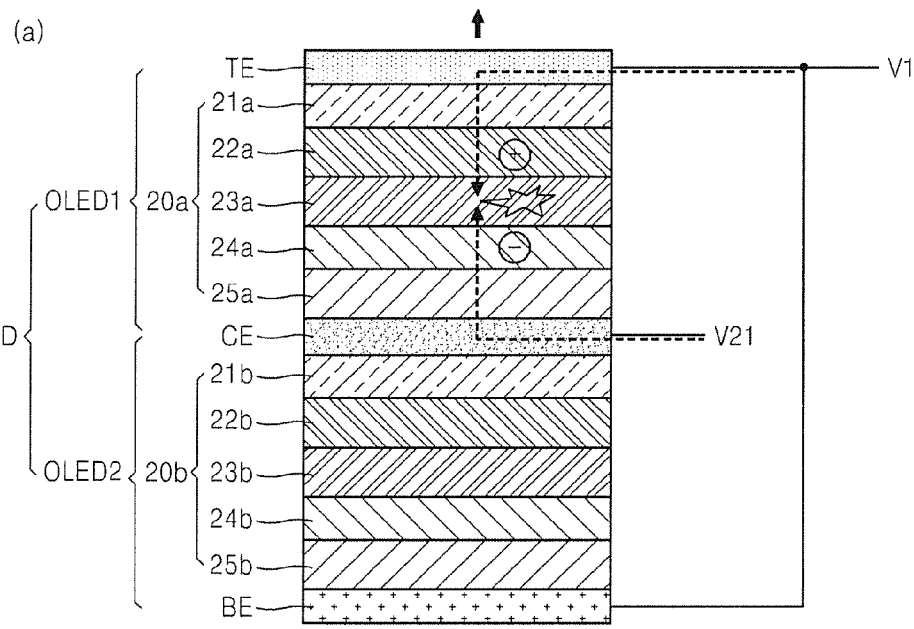
FIG. 10 is a view for explaining a dual emission of the organic light-emitting diode of FIG. 6 according to the timing diagram of FIG. 7, according to an embodiment of the present invention.
Figure 10:
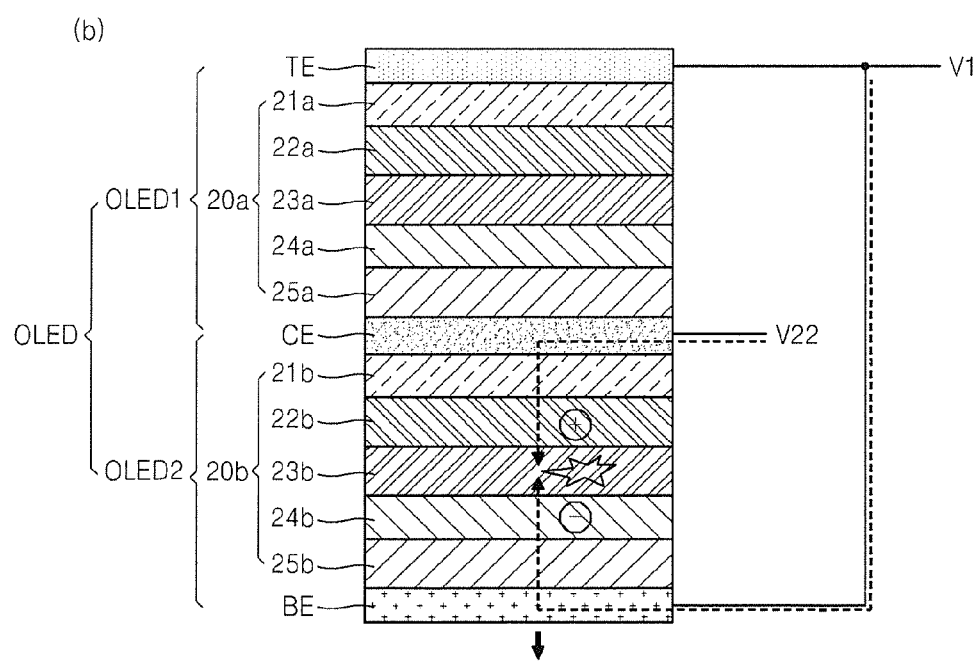

FIG. 10 is a view for explaining a dual emission of the organic light-emitting diode OLED of FIG. 6 according to the timing diagram of FIG. 7, according to an embodiment of the present invention.

Referring to FIGS. 7 and 10(a), during the second period T1, the fixed first power voltage V1 is applied to the top electrode TE and the bottom electrode BE, and the third voltage V21 is applied as the second power voltage V2 to the common electrode CE. Accordingly, the first organic light-emitting diode OLED1 formed between the top electrode TE and the common electrode CE is forward-biased, and the second organic light-emitting diode OLED2 formed between the bottom electrode BE and the common electrode CE is reverse-biased.

Thus, the top electrode TE of the first organic light-emitting diode OLED1 functions as a hole injection electrode, and the common electrode CE functions as an electron injection electrode. Electrons are injected from the common electrode CE of the first organic light-emitting diode OLED1 through the EIL 25a and the ETL 24a, and holes are injected from the top electrode TE through the HIL 21a and the HTL 22a. The electrons and holes are combined in the EML 23a to form excitons, and due to energy from the formed excitons, light is emitted. Since the common electrode CE is a reflective electrode, the generated light is emitted toward the top electrode TE (back side).

Referring to FIGS. 7 and 10(b), during the second period T2, the fixed first power voltage V1 is applied to the top electrode TE and the bottom electrode BE, and the fourth voltage V22 is applied as the second power voltage V2 to the common electrode CE. Accordingly, the first organic light-emitting diode OLED1 formed between the top electrode TE and the common electrode CE is reverse-biased, and the second organic light-emitting diode OLED2 formed between the bottom electrode BE and the common electrode CE is forward-biased.

Thus, the bottom electrode BE of the second organic light-emitting diode OLED1 functions as an electron injection electrode, and the common electrode CE functions as a hole injection electrode. Electrons are injected from the bottom electrode BE of the second organic light-emitting diode OLED2 through the EIL 25b and the ETL 24b, and holes are injected from the common electrode CE through the HIL 21b and the HTL 22b. The electrons and holes are combined in the EML 23b to form excitons, and due to energy from the formed excitons, light is emitted. Since the common electrode CE is a reflective electrode, the generated light is emitted toward the bottom electrode BE (front side).

That is, according to the present embodiment, the second power voltage V2 applied to the organic light-emitting diode OLED varies to alternately control a front side emission and a back side emission to produce images on back and front sides.

Figure 11:
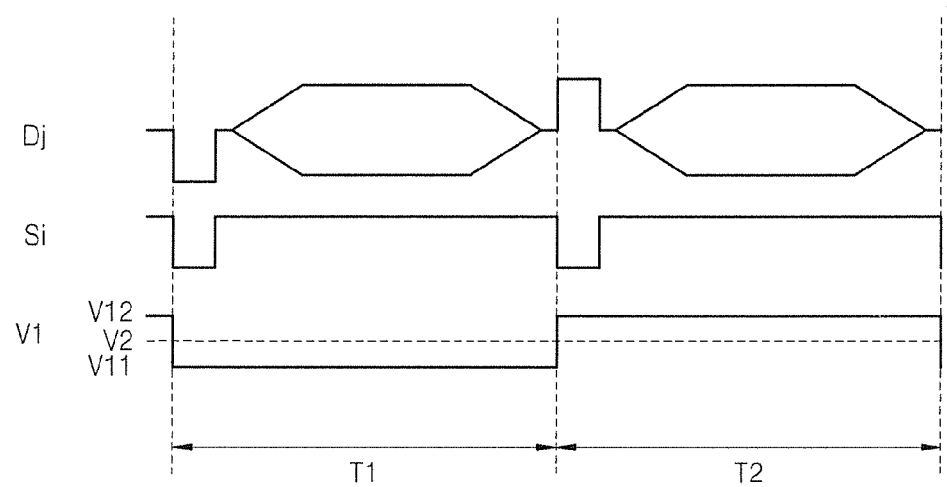
FIG. 11 is a timing diagram for explaining a dual emission of an organic light-emitting diode, according to another embodiment of the present invention.
Figure 12:
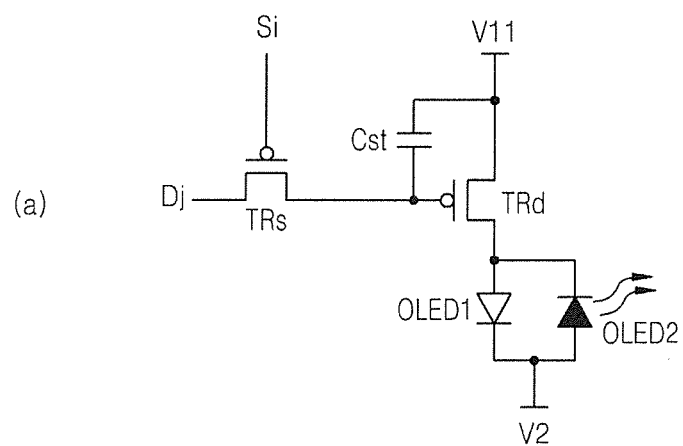
FIG. 12 is a diagram illustrating a dual emission of an organic light-emitting diode according to the timing diagram of FIG. 11.
Figure 12:
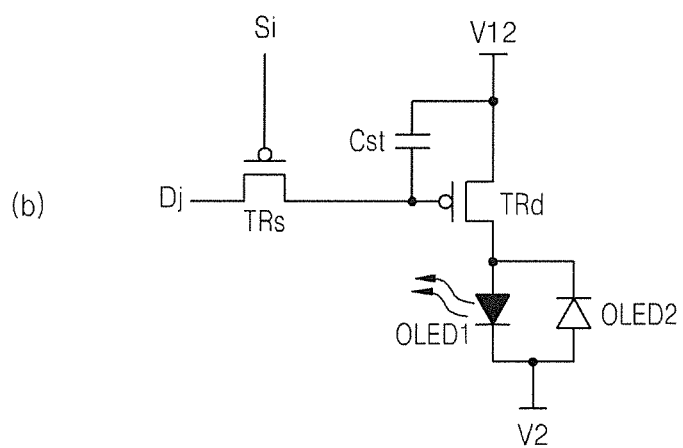

FIG. 11 is a timing diagram for explaining a dual emission of an organic light-emitting diode OLED, according to another embodiment of the present invention. FIG. 12 is a circuit diagram illustrating a dual emission of the organic light-emitting diode OLED according to the timing diagram of FIG. 11.

Referring to FIGS. 11 and 12, when a scan signal Si is supplied through a scan line, the switching thin film transistor TRs is turned on to supply a data signal Dj supplied through a data line to the storage capacitor Cst.

In this regard, the second power voltage V2 is fixed and the first power voltage V1 alternately swings between the first voltage V11 and the second voltage V12. That is, during the first period T1, the first voltage V11 is applied as the first power voltage V1, and during the second period T2, the second voltage V12 is applied as the first power voltage V1. The first voltage V11 is a voltage with a lower level than the second power voltage V2, and the second voltage V12 is a voltage with a higher level than the second power voltage V2. For example, the second power voltage V2 may be 12 V, the first voltage V11 may be 0 V, and the second voltage V12 may be 24 V. Each of the first period T1 and the second period T2 may constitute one frame period, or the sum of the first period T1 and the second period T2 may constitute one frame period. That is, the first power voltage V1 may vary in every frame, or may vary within one frame.

During the first period T1, when the first voltage V11 and the second power voltage V2 are applied to the pixel PX, the first organic light-emitting diode OLED1 is reverse-biased and the second organic light-emitting diode OLED2 is forward-biased. The driving thin film transistor TRd may, corresponding to a voltage stored in the storage capacitor Cst, control a current flowing between the first voltage V11 and the second power voltage V2 through the second organic light-emitting diode OLED2, and accordingly, as illustrated in FIG. 12(a), the second organic light-emitting diode OLED2 emits light.

During the second period T2, the first power voltage V1 is transitioned to the second voltage V12 from the first voltage V11. During the second period T2, when the second voltage V12 and the second power voltage V2 are applied to the pixel PX, the second organic light-emitting diode OLED 2 is reverse-biased and the first organic light-emitting diode OLED1 is forward-biased. The driving thin film transistor TRd may, corresponding to a voltage stored in the storage capacitor Cst, control a current flowing between the second voltage V12 and the second power voltage V2 through the first organic light-emitting diode OLED1, and accordingly, as illustrated in FIG. 12(b), the first organic light-emitting diode OLED1 emits light.

Figure 13:
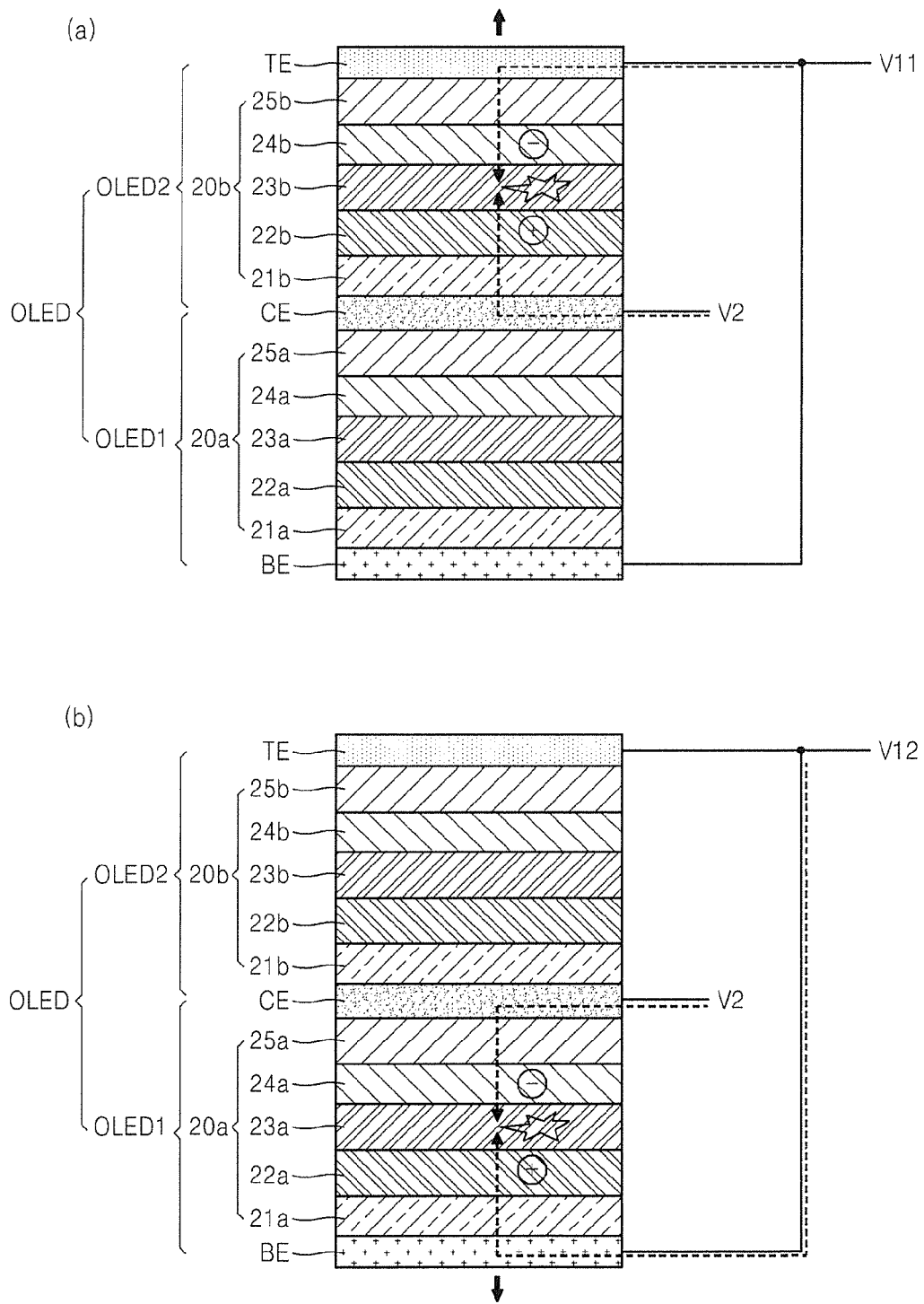
FIG. 13 is a view for explaining a dual emission of the organic light-emitting diode of FIG. 5 according to the timing diagram of FIG. 11, according to another embodiment of the present invention.

FIG. 13 is a view for explaining a dual emission of the organic light-emitting diode OLED of FIG. 5 according to the timing diagram of FIG. 11, according to another embodiment of the present invention.

Referring to FIGS. 11 and 13(a), during the first period T1, the first voltage V11 is applied as the first power voltage V1 to the top electrode TE and the bottom electrode BE, and the fixed second power voltage V2 is applied to the common electrode CE. Accordingly, the second organic light-emitting diode OLED2 formed between the top electrode TE and the common electrode CE is forward-biased, and the first organic light-emitting diode OLED1 formed between the bottom electrode BE and the common electrode CE is reverse-biased. Thus, the top electrode TE of the second organic light-emitting diode OLED2 functions as an electron injection electrode, and the common electrode CE functions as a hole injection electrode.

Electrons are injected from the top electrode TE of the second organic light-emitting diode OLED2 through the EIL 25b and the ETL 24b, and holes are injected from the common electrode CE through the HIL 21b and the HTL 22b. The electrons and holes are combined in the EML 23b to form excitons, and due to energy from the formed excitons, light is emitted. Since the common electrode CE is a reflective electrode, the generated light is emitted toward the top electrode TE (back side).

Referring to FIGS. 11 and 13(b), during the second period T2, the second voltage V12 is applied as the first power voltage V1 to the top electrode TE and the bottom electrode BE, and the fixed second power voltage V2 is applied to the common electrode CE. Accordingly, the second organic light-emitting diode OLED2 formed between the top electrode TE and the common electrode CE is reverse-biased, and the first organic light-emitting diode OLED1 formed between the bottom electrode BE and the common electrode CE is forward-biased. Thus, the bottom electrode BE of the first organic light-emitting diode OLED1 functions as a hole injection electrode, and the common electrode CE functions as an electron injection electrode.

Electrons are injected from the common electrode CE of the first organic light-emitting diode OLED1 through the EIL 25a and the ETL 24a, and holes are injected from the bottom electrode BE through the HIL 21a and the HTL 22a. The electrons and holes are combined in the EML 23a to form excitons, and due to energy from the formed excitons, light is emitted. Since the common electrode CE is a reflective electrode, the generated light is emitted toward the bottom electrode BE (front side).

That is, according to the present embodiment, the first power voltage V1 applied to the organic light-emitting diode OLED varies to alternately control a front side emission and a back side emission to produce images on back and front sides thereof.

Figure 14:
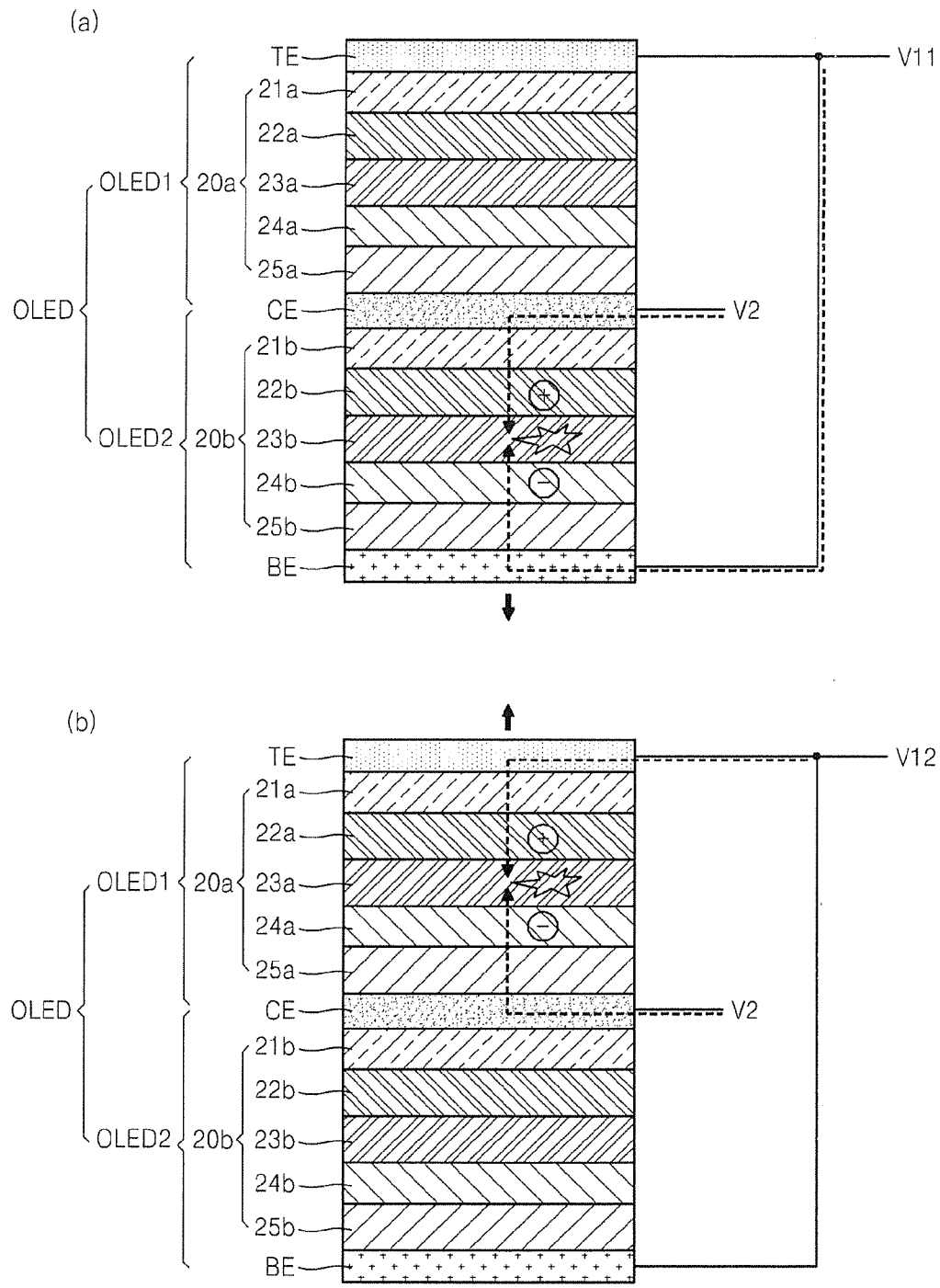
FIG. 14 is a view for explaining a dual emission of the organic light-emitting diode of FIG. 6 according to the timing diagram of FIG. 11, according to another embodiment of the present invention.

FIG. 14 is a view for explaining a dual emission of the organic light-emitting diode OLED of FIG. 6 according to the timing diagram of FIG. 11, according to another embodiment of the present invention.

Referring to FIGS. 11 and 14(a), the first voltage V11 is applied as the first power voltage V1 to the top electrode TE and the bottom electrode BE, and the fixed second power voltage V2 is applied to the common electrode CE. Accordingly, the second organic light-emitting diode OLED2 formed between the bottom electrode BE and the common electrode CE is forward-biased, and the first organic light-emitting diode OLED1 formed between the top electrode TE and the common electrode CE is reverse-biased. Thus, the bottom electrode BE of the second organic light-emitting diode OLED2 functions as an electron injection electrode, and the common electrode CE functions as a hole injection electrode.

Electrons are injected from the bottom electrode BE of the second organic light-emitting diode OLED2 through the EIL 25b and the ETL 24b, and holes are injected from the common electrode CE through the HIL 21b and the HTL 22b. The electrons and holes are combined in the EML 23b to form excitons, and due to energy from the formed excitons, light is emitted. Since the common electrode CE is a reflective electrode, the generated light is emitted toward the bottom electrode BE (front side).

Referring to FIGS. 11 and 14(b), during the second period T2, the second voltage V12 is applied as the first power voltage V1 to the top electrode TE and the bottom electrode BE, and the fixed second power voltage V2 is applied to the common electrode CE. Accordingly, the second organic light-emitting diode OLED2 formed between the bottom electrode BE and the common electrode CE is reverse-biased, and the first organic light-emitting diode OLED1 formed between the top electrode TE and the common electrode CE is forward-biased. Thus, the top electrode TE of the first organic light-emitting diode OLED1 functions as a hole injection electrode, and the common electrode CE functions as an electron injection electrode.

Electrons are injected from the common electrode CE of the first organic light-emitting diode OLED1 through the EIL 25a and the ETL 24a, and holes are injected from the top electrode TE through the HIL 21a and the HTL 22a. The electrons and holes are combined in the EML 23a to form excitons, and due to energy from the formed excitons, light is emitted. Since the common electrode CE is a reflective electrode, the generated light is emitted toward the top electrode TE (back side).

That is, according to the present embodiment, the first power voltage V1 applied to the organic light-emitting diode OLED varies to alternately control a front side emission and a back side emission to produce images on back and front sides thereof.

Figure 15:
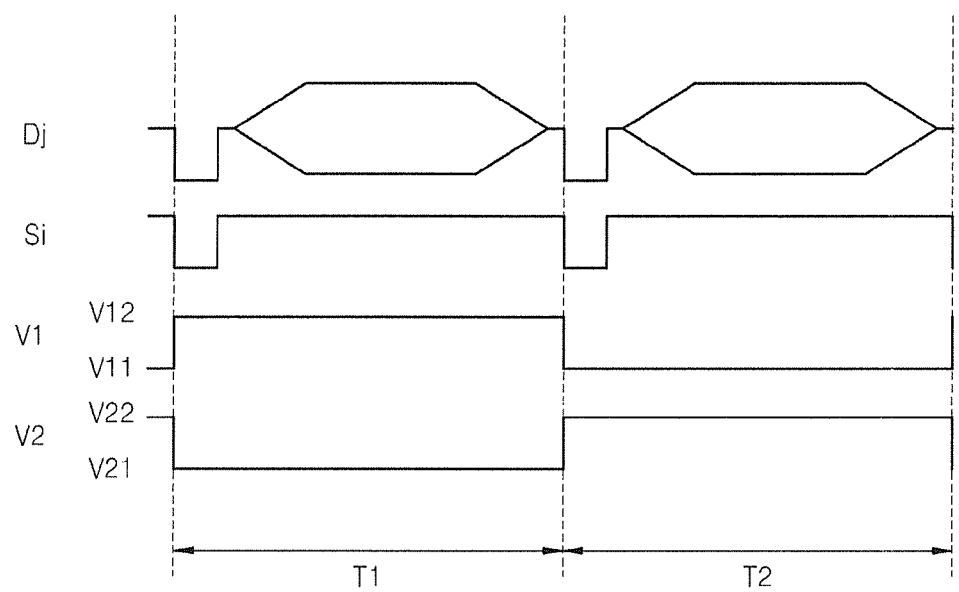
FIG. 15 is a timing diagram for explaining a dual emission of an organic light-emitting diode, according to another embodiment of the present invention.
Figure 16:
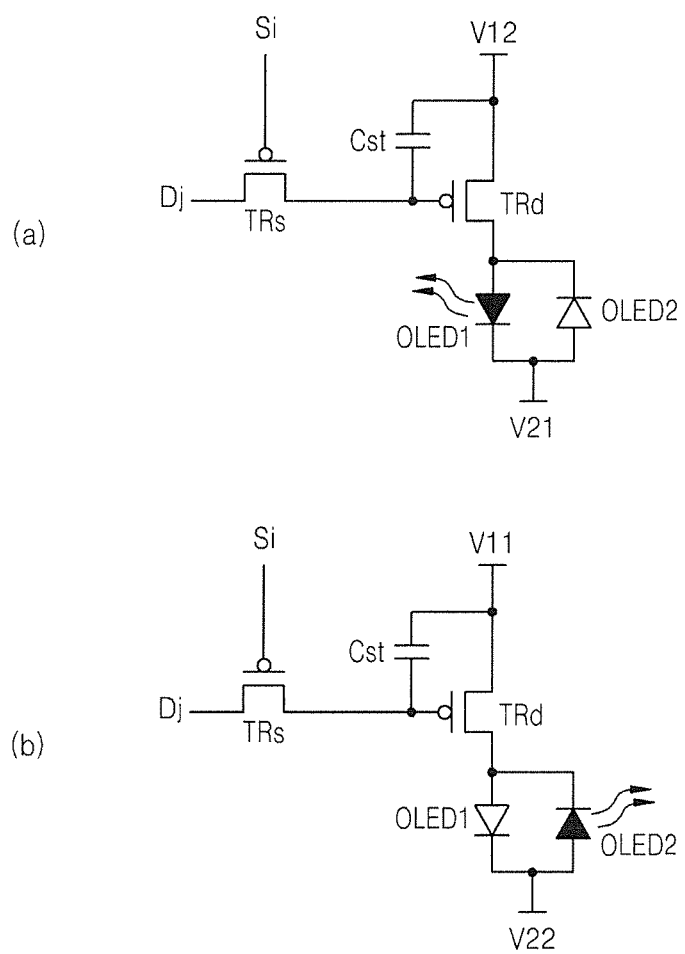
FIG. 16 is a diagram illustrating a dual emission of an organic light-emitting diode according to the timing diagram of FIG. 15.

FIG. 15 is a timing diagram for explaining a dual emission of an organic light-emitting diode OLED, according to another embodiment of the present invention. FIG. 16 is a circuit diagram illustrating a dual emission of the organic light-emitting diode OLED according to the timing diagram of FIG. 15.

Referring to FIGS. 15 and 16, when a scan signal Si is supplied through a scan line, the switching thin film transistor TRs is turned on to supply a data signal Dj supplied through a data line to the storage capacitor Cst.

In this regard, the first power voltage V1 alternately swings between the first voltage V11 and the second voltage V12 and the second power voltage V2 alternately swings between the third voltage V21 and the fourth voltage V22. Herein, the first power voltage V1 and the second power voltage V2 may be inversion signals. The first voltage V11 and the third voltage V21 may be a voltage with an identical level, and the second voltage V12 and the fourth voltage V22 may be a voltage with an identical level. For example, the first voltage V11 and the third voltage V21 may be 0 V, and the second voltage V12 and the fourth voltage V22 may be 12 V. Each of the first period T1 and the second period T2 may constitute one frame period, or the sum of the first period T1 and the second period T2 may constitute one frame period. That is, the first power voltage V1 and the second power voltage V2 may vary in every frame, or may vary within one frame.

During the first period T1, when the second voltage V12 and the third power voltage V21 are applied to the pixel PX, the first organic light-emitting diode OLED1 is forward-biased and the second organic light-emitting diode OLED2 is reverse-biased. The driving thin film transistor TRd may, corresponding to a voltage stored in the storage capacitor Cst, control a current flowing between the second voltage V12 and the third voltage V21 through the first organic light-emitting diode OLED1, and accordingly, as illustrated in FIG. 16(a), the first organic light-emitting diode OLED1 emits light.

During the second period T2, the first power voltage V1 is transitioned from the second voltage V12 to the first voltage V11, and the second power voltage V2 is transitioned from the third voltage V21 to the fourth voltage V22. During the second period T2, when the first voltage V11 and the fourth voltage V22 are applied to the pixel PX, the first organic light-emitting diode OLED1 is reverse-biased and the second organic light-emitting diode OLED2 is forward-biased. The driving thin film transistor TRd may, corresponding to a voltage stored in the storage capacitor Cst, control a current flowing between the first voltage V11 and the fourth voltage V22 through the second organic light-emitting diode OLED2, and accordingly, as illustrated in FIG. 16(b), the second organic light-emitting diode OLED2 emits light.

Compared to the embodiments illustrated in FIGS. 7 and 11 in which only one power voltage varies, in the case of the embodiment illustrated in FIG. 15 in which two power voltages vary, a data signal range may decrease, and thus, a voltage of a scan signal may decrease. Accordingly, power consumption of a driving circuit decreases and a lifetime of a display device increases.

Figure 17:
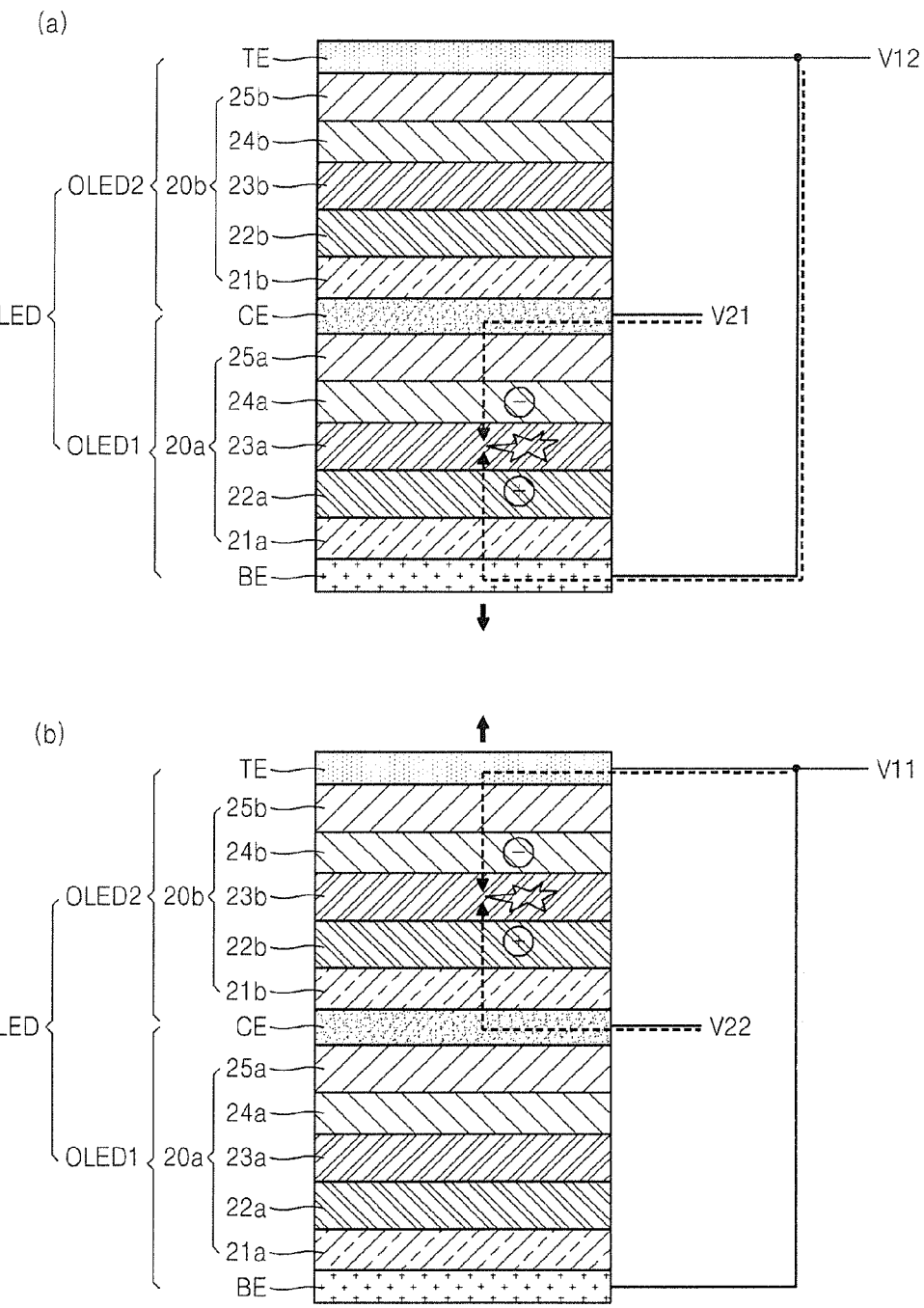
FIG. 17 is a view for explaining a dual emission of the organic light-emitting diode of FIG. 5 according to the timing diagram of FIG. 15, according to another embodiment of the present invention.

FIG. 17 is a view for explaining a dual emission of the organic light-emitting diode OLED of FIG. 5 according to the timing diagram of FIG. 15, according to another embodiment of the present invention.

Referring to FIGS. 15 and 17(a), during the second period T1, the second voltage V12 is applied as the first power voltage V1 to the top electrode TE and the bottom electrode BE, and the third voltage V21 is applied as the second power voltage V2 to the common electrode CE. Accordingly, the second organic light-emitting diode OLED2 formed between the top electrode TE and the common electrode CE is reverse-biased, and the first organic light-emitting diode OLED1 formed between the bottom electrode BE and the common electrode CE is forward-biased. Thus, the bottom electrode BE of the first organic light-emitting diode OLED1 functions as a hole injection electrode, and the common electrode CE functions as an electron injection electrode.

Electrons are injected from the common electrode CE of the first organic light-emitting diode OLED1 through the EIL 25a and the ETL 24a, and holes are injected from the bottom electrode BE through the HIL 21a and the HTL 22a. The electrons and holes are combined in the EML 23a to form excitons, and due to energy from the formed excitons, light is emitted. Since the common electrode CE is a reflective electrode, the generated light is emitted toward the bottom electrode BE (front side).

Referring to FIGS. 15 and 17(b), during the second period T2, the first voltage V11 is applied as the first power voltage V1 to the top electrode TE and the bottom electrode BE, and the fourth voltage V22 is applied as the second power voltage V2 to the common electrode CE. Accordingly, the second organic light-emitting diode OLED2 formed between the top electrode TE and the common electrode CE is forward-biased, and the first organic light-emitting diode OLED1 formed between the bottom electrode BE and the common electrode CE is reverse-biased. Thus, the top electrode TE of the second organic light-emitting diode OLED2 functions as an electron injection electrode, and the common electrode CE functions as a hole injection electrode.

Electrons are injected from the top electrode TE of the second organic light-emitting diode OLED2 through the EIL 25b and the ETL 24b, and holes are injected from the common electrode CE through the HIL 21b and the HTL 22b. The electrons and holes are combined in the EML 23b to form excitons, and due to energy from the formed excitons, light is emitted. Since the common electrode CE is a reflective electrode, the generated light is emitted toward the top electrode TE (back side).

That is, according to the present embodiment, the first power voltage V1 and the second power voltage V2 applied to the organic light-emitting diode OLED vary to alternately control a front side emission and a back side emission to produce images on back and front sides.

Figure 18:
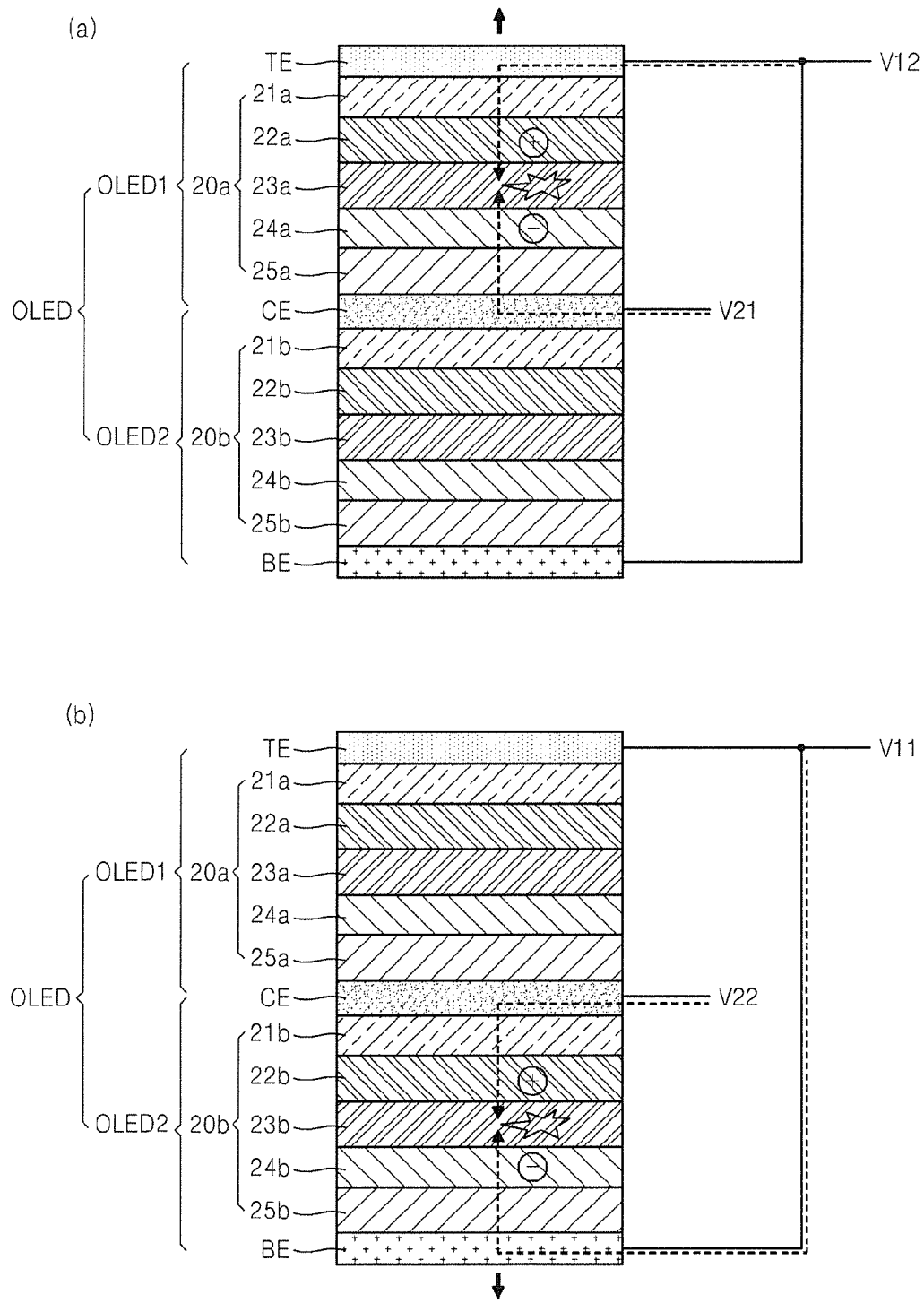
FIG. 18 is a view for explaining a dual emission of the organic light-emitting diode of FIG. 6 according to the timing diagram of FIG. 15, according to another embodiment of the present invention.

FIG. 18 is a view for explaining a dual emission of the organic light-emitting diode OLED of FIG. 6 according to the timing diagram of FIG. 15, according to another embodiment of the present invention.

Referring to FIGS. 15 and 18(a), during the second period T1, the second voltage V12 is applied as the first power voltage V1 to the top electrode TE and the bottom electrode BE, and the third voltage V21 is applied as the second power voltage V2 to the common electrode CE. Accordingly, the first organic light-emitting diode OLED1 formed between the top electrode TE and the common electrode CE is forward-biased, and the second organic light-emitting diode OLED2 formed between the bottom electrode BE and the common electrode CE is reverse-biased. Thus, the top electrode TE of the first organic light-emitting diode OLED1 functions as a hole injection electrode, and the common electrode CE functions as an electron injection electrode.

Electrons are injected from the common electrode CE of the first organic light-emitting diode OLED1 through the EIL 25a and the ETL 24a, and holes are injected from the top electrode TE through the HIL 21a and the HTL 22a. The electrons and holes are combined in the EML 23a to form excitons, and due to energy from the formed excitons, light is emitted. Since the common electrode CE is a reflective electrode, the generated light is emitted toward the top electrode TE (back side).

Referring to FIGS. 15 and 18(b), during the second period T2, the first voltage V11 is applied as the first power voltage V1 to the top electrode. TE and the bottom electrode BE, and the fourth voltage V22 is applied as the second power voltage V2 to the common electrode CE. Accordingly, the first organic light-emitting diode OLED1 formed between the top electrode TE and the common electrode CE is reverse-biased, and the second organic light-emitting diode OLED2 formed between the bottom electrode BE and the common electrode CE is forward-biased. Thus, the bottom electrode BE of the second organic light-emitting diode OLED2 functions as an electron injection electrode, and the common electrode CE functions as a hole injection electrode.

Electrons are injected from the bottom electrode BE of the second organic light-emitting diode OLED2 through the EIL 25b and the ETL 24b, and holes are injected from the common electrode CE through the HIL 21b and the HTL 22b. The electrons and holes are combined in the EML 23b to form excitons, and due to energy from the formed excitons, light is emitted. Since the common electrode CE is a reflective electrode, the generated light is emitted toward the bottom electrode BE (front side).

That is, according to the present embodiment, the first power voltage V1 and the second power voltage V2 applied to the organic light-emitting diode OLED vary to alternately control a front side emission and a back side emission to produce images on back and front sides thereof.

Figure 19:
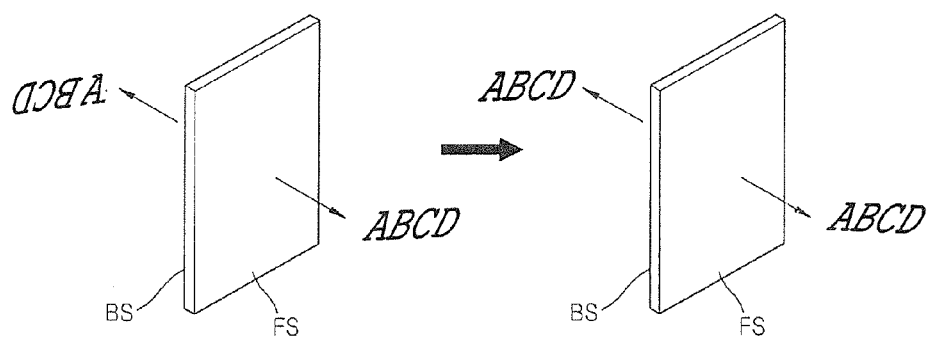
FIG. 19 is a view for illustrating a dual emission according to embodiments of the present invention and a dual emission according to a comparative embodiment.

FIG. 19 is a view for illustrating a dual emission according to embodiments of the present invention and a dual emission according to a comparative embodiment.

As a comparative embodiment, a display device including a typical organic light-emitting diode including an anode, a cathode, and an organic EML interposed between the anode and the cathode is illustrated, and the transmittancy of the anode and cathode of the display device is controlled to perform a dual emission. In this regard, an image is embodied on both sides. However, this is a simple change of an emission direction toward the front side FS into an emission direction toward the back side BS, and thus, an image on the front side FS and an image on the back side BS are inversed, and thus, delivery of desired information is impossible.

On the other hand, a dual emission according to an embodiment of the present invention illustrated on the right side of FIG. 19 may be embodied using such a structure including two organic layers each including an EML and an intermediate electrode formed between top and bottom electrodes, and according to a variation of a power voltage, time-sharing emission is performed on the front side FS and the back side BS in each pixel. Accordingly, an image on the front side FS and the back side BS may not have to be inversed.

According to embodiments of the present invention, two organic layers are deposited in each pixel, and an intermediate electrode is used to control front side emission and back side emission according to an input signal in each pixel, thereby providing a dual emission display producing different images on a front side and a back side in each pixel.

The previous embodiments have been described using a pixel including two thin film transistors and one capacitor. However, the present invention is not limited thereto, and may also be applied to a pixel including an organic light-emitting diode having a stack structure according to the present invention, a plurality of thin film transistors, and a plurality of capacitors.

An organic light-emitting display device according to an embodiment of the present invention overcomes the problems of a typical dual emission display device, such as reversion of an image or the requirement of manufacturing two panels, and embodies a dual emission display device that emits light in two directions in each pixel without reversion of an image.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting diode comprising:
   a first electrode;
   a second electrode facing the first electrode;
   a common electrode between the first electrode and the second electrode;
   a first organic layer between the first electrode and the common electrode; and
   a second organic layer between the second electrode and the common electrode and being reverse-symmetric to the first organic layer with respect to the common electrode,
   wherein the common electrode is a reflective electrode,
   wherein the first electrode and the second electrode are configured to receive a first power voltage, and the common electrode is configured to receive a second power voltage, and
   wherein according to a variation of at least one of the first power voltage or the second power voltage, alternately the first organic layer emits light toward the first electrode and the second organic layer emits light toward the second electrode.

2. The organic light-emitting diode of claim 1, wherein the first organic layer comprises a hole injection layer, a hole transfer layer, an emission layer, an electron transfer layer, and an electron injection layer, sequentially disposed in this order on the first electrode, and
   the second organic layer comprises an electron injection layer, an electron transfer layer, an emission layer, a hole transfer layer, and a hole injection layer, sequentially disposed in this order on the second electrode.

3. The organic light-emitting diode of claim 1, wherein the first electrode is a bottom electrode, and the second electrode is a top electrode.

4. The organic light-emitting diode of claim 1, wherein the first electrode is a top electrode, and the second electrode is a bottom electrode.

5. The organic light-emitting diode of claim 1, wherein according to a variation of at least one of the first power voltage or the second power voltage, the common electrode functions as an electron injection electrode or a hole injection electrode.

6. The organic light-emitting diode of claim 1, wherein each of the first electrode and the second electrode is a transparent electrode or a semi-transparent electrode.

7. The organic light-emitting diode of claim 1, wherein one of the first electrode and the second electrode is formed on a substrate.

8. A method of controlling a dual emission of an organic light-emitting diode, wherein the organic light-emitting diode comprises a first electrode, a second electrode, a pair of organic layers disposed between the first and second electrodes, and a common electrode that divides the organic layers between the first electrode and the second electrode, the method comprising:

applying a first power voltage to the first electrode and the second electrode; and applying a second power voltage to the common electrode, wherein at least one of the first power voltage or the second power voltage varies to make the organic layers alternately emit light toward the first electrode and the second electrode in response to this variation, wherein the common electrode is a reflective electrode.

9. The method of claim 8, wherein the applying of the second power voltage comprises alternately applying the second power voltage with higher and lower levels than that of the first power voltage to the common electrode.

10. The method of claim 8, wherein the applying of the first power voltage comprises alternately applying the first power voltage with higher and lower levels than that of the second power voltage to the first electrode and the second electrode.

11. The method of claim 8, wherein the applying of the first power voltage comprises applying the first power voltage with a first level and a second level that is higher than the first level, and the applying of the second power voltage comprises alternately applying the second power voltage with the first level and the second level, wherein the first power voltage and the second power voltage are inversion voltages.

12. An organic light-emitting display device comprising:

a plurality of organic light-emitting diodes comprising a first electrode, a second electrode, a common electrode between the first electrode and the second electrode, and a pair of organic layers that are reverse-symmetric to each other with respect to the common electrode between the first electrode and the second electrode; and a power supplier for applying a first power voltage to the first and second electrodes and a second power voltage to the common electrode and varying at least one of the first power voltage or the second power voltage, wherein each of the organic light-emitting diodes is configured to emit light either toward the first electrode or toward the second electrode according to the varied at least one of the first power voltage or the second power voltage, and wherein the common electrode is a reflective electrode.

13. The organic light-emitting display device of claim 12, wherein the power supplier is configured to fix the first power voltage and apply the second power voltage with higher and lower levels than the first power voltage to the common electrode.

14. The organic light-emitting display device of claim 12, wherein the power supplier is configured to fix the second power voltage and apply the first power voltage with higher and lower levels than the second power voltage to the first electrode and the second electrode.

15. The organic light-emitting display device of claim 12, wherein the power supplier is configured to alternately apply the first power voltage with a first level and a second level that is higher than the first level, and simultaneously, alternately apply the second power voltage with the first level and the second level, wherein the first power voltage and the second power voltage are inversion voltages.

16. The organic light-emitting display device of claim 12, wherein at least one of the first power voltage or the second power voltage varies in every frame.

17. The organic light-emitting display device of claim 12, wherein at least one of the first power voltage or the second power voltage varies within one frame.

18. The organic light-emitting display device of claim 12, wherein one of the first electrode and the second electrode is formed on a substrate.

19. The organic light-emitting display device of claim 12, wherein each of the first electrode and the second electrode is a transparent electrode or a semi-transparent electrode.

* * * * *